(12) United States Patent
Lai et al.

(10) Patent No.: US 8,530,326 B2
(45) Date of Patent: Sep. 10, 2013

(54) METHOD OF FABRICATING A DUMMY GATE STRUCTURE IN A GATE LAST PROCESS

(76) Inventors: Su-Chen Lai, Hsinchu (TW);
Ming-Yuan Wu, Hsinchu (TW);
Kong-Beng Thei, Pao-Shan Villiage (TW); Hak-Lay Chuang, Hsinchu (TW); Chiung-Han Yeh, Tainan (TW); Hong-Dyi Chang, Taipei (TW); Kuo Cheng-Cheng, Baoshan Township, Hsinchu County (TW); Chien-Hung Wu, Tainan (TW); Tzung-Chi Lee, Hsin Banciao (TW)

( * ) Notice: Subject to any disclaimer, the term of this patent is extended or adjusted under 35 U.S.C. 154(b) by 0 days.

(21) Appl. No.: 13/538,220

(22) Filed: Jun. 29, 2012

(65) Prior Publication Data
US 2012/0270379 A1    Oct. 25, 2012

Related U.S. Application Data

(63) Continuation of application No. 12/455,509, filed on Jun. 3, 2009, now Pat. No. 8,237,227.

(60) Provisional application No. 61/093,209, filed on Aug. 29, 2008.

(51) Int. Cl.
*H01L 21/76*   (2006.01)

(52) U.S. Cl.
USPC ................................. 438/401; 257/E21.54

(58) Field of Classification Search
USPC .................. 438/401; 257/E21.54, 268, 499, 257/E27.017, E21.598
See application file for complete search history.

(56) References Cited

U.S. PATENT DOCUMENTS

| 6,441,456 | B1 | 8/2002 | Konishi et al. |
|---|---|---|---|
| 7,315,054 | B1 | 1/2008 | Moench et al. |
| 2001/0043449 | A1 | 11/2001 | Okushima |
| 2001/0055842 | A1 | 12/2001 | Uh et al. |
| 2002/0024076 | A1 | 2/2002 | Nakabayashi |
| 2004/0152243 | A1 | 8/2004 | Kuroda et al. |
| 2007/0221957 | A1 | 9/2007 | Kitajima et al. |
| 2007/0228440 | A1 | 10/2007 | Chaudhry et al. |
| 2008/0246092 | A1 | 10/2008 | Lee et al. |
| 2008/0258232 | A1 | 10/2008 | Mizumura |

FOREIGN PATENT DOCUMENTS

| CN | 101027761 | 8/2007 |
|---|---|---|
| CN | 101038918 | 9/2007 |

OTHER PUBLICATIONS

Chinese Patent Office, Office Action dated Oct. 26, 2010, Application No. 200910163584.3. 8 pages.

*Primary Examiner* — Tony Tran
(74) *Attorney, Agent, or Firm* — Haynes and Boone, LLP

(57) ABSTRACT

A method of semiconductor device fabrication including forming a plurality of gate structures in a first portion of a substrate, wherein the plurality of gate structures have a first height. A first metal gate structure is formed in a second portion of the substrate, the first metal gate structure being surrounded by an isolation region. A plurality of dummy gate structures is formed in the second portion of the substrate. The plurality of dummy gate structures are configured in a ring formation encircling the metal gate structure and the isolation region. The plurality of dummy structures have a top surface that is substantially planar with the plurality of gate structures and covers at least 5% of a pattern density of the second portion of the substrate.

17 Claims, 17 Drawing Sheets

METHOD OF FABRICATING A DUMMY GATE STRUCTURE IN A GATE LAST PROCESS

PRIORITY DATA

This application is a continuation application of Ser. No. 12/455,509, filed on Jun. 3, 2009, entitled "Dummy Gate Structure For Gate Last Process," which claims priority to Provisional Application Ser. No. 61/093,209, filed on Aug. 29, 2008, entitled "A Novel Dummy Poly Structure For A Gate Last Process," the entire disclosures of which are incorporated herein by reference.

BACKGROUND

The present disclosure relates generally to forming an semiconductor device and, more particularly, to forming dummy poly structures for a gate last process.

Semiconductor device geometries continue to dramatically decrease in size since such devices were first introduced several decades ago. Today's fabrication plants are routinely producing devices having feature dimensions less than 65 nm. However, solving the problems associated with implementing new processes and equipment technology while continuing to satisfy device requirements has become more challenging. For example, metal-oxide semiconductor (MOS) transistors have typically been formed with polysilicon gate electrodes. Polysilicon material has been used due to its thermal resistive properties during high temperature processing, which allows it to be annealed at high temperatures along with source/drain structures. Furthermore, polysilicon's ability to block the ion implantation of doping atoms into the channel region is advantageous, as it allows for the easy formation of self aligned source/drain structures after gate patterning is completed.

In some IC designs, there has been a desire to replace the polysilicon gate electrode with a metal gate electrode to improve device performance as feature sizes continue to decrease. A gate last process may be implemented to address the concerns of high temperature processing on metal materials. In a gate last process, a dummy poly gate is initially formed and processing may continue until deposition of an interlayer dielectric (ILD). The dummy poly gate may then be removed and replaced with a metal gate. However, problems arise when integrating a gate last process with other structures and devices typically found in semiconductor fabrication such as resistors, diodes, bipolar junction transistors (BJTs), monitor pads, alignment marks, and overlay marks.

SUMMARY

One of the broader forms of an embodiment of the invention involves a semiconductor device. The semiconductor device includes a semiconductor substrate having a first portion and a second portion; a plurality of transistors formed in the first portion of the substrate, each transistor having a gate structure with a high-k dielectric and a metal gate; a device element formed in the second portion of the substrate, the device element being isolated by an isolation region; and a polishing stopper formed adjacent the isolation region and having a surface that is substantially planar with a surface of the gate structures of the transistors in the first region.

Another one of the broader forms of an embodiment of the invention involves a semiconductor device. The semiconductor device includes a semiconductor substrate having a first area and a second area, the first and second areas being isolated from each other; a plurality of transistors formed in the first area, each transistor including a gate structure with a high-k gate dielectric and a metal gate electrode; a device element formed in the second area; and a polishing stopper formed over the substrate and around an edge of the second area, the polishing stopper having a height that is substantially the same as a height of the gate structure of the transistors.

Yet another one of the broader forms of an embodiment of the invention involves a method of fabricating semiconductor device. The method includes providing a semiconductor substrate having a first portion and a second portion; forming a plurality of transistors in the first portion of the substrate, each transistor including a dummy gate structure; forming a device element in the second region, the device element being isolated by an isolation region; forming a polishing stopper adjacent the isolation region, the polishing stopper being formed in a same process that forms the dummy gate structure of the transistors; and replacing the dummy gate structure of each transistor with a metal gate.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
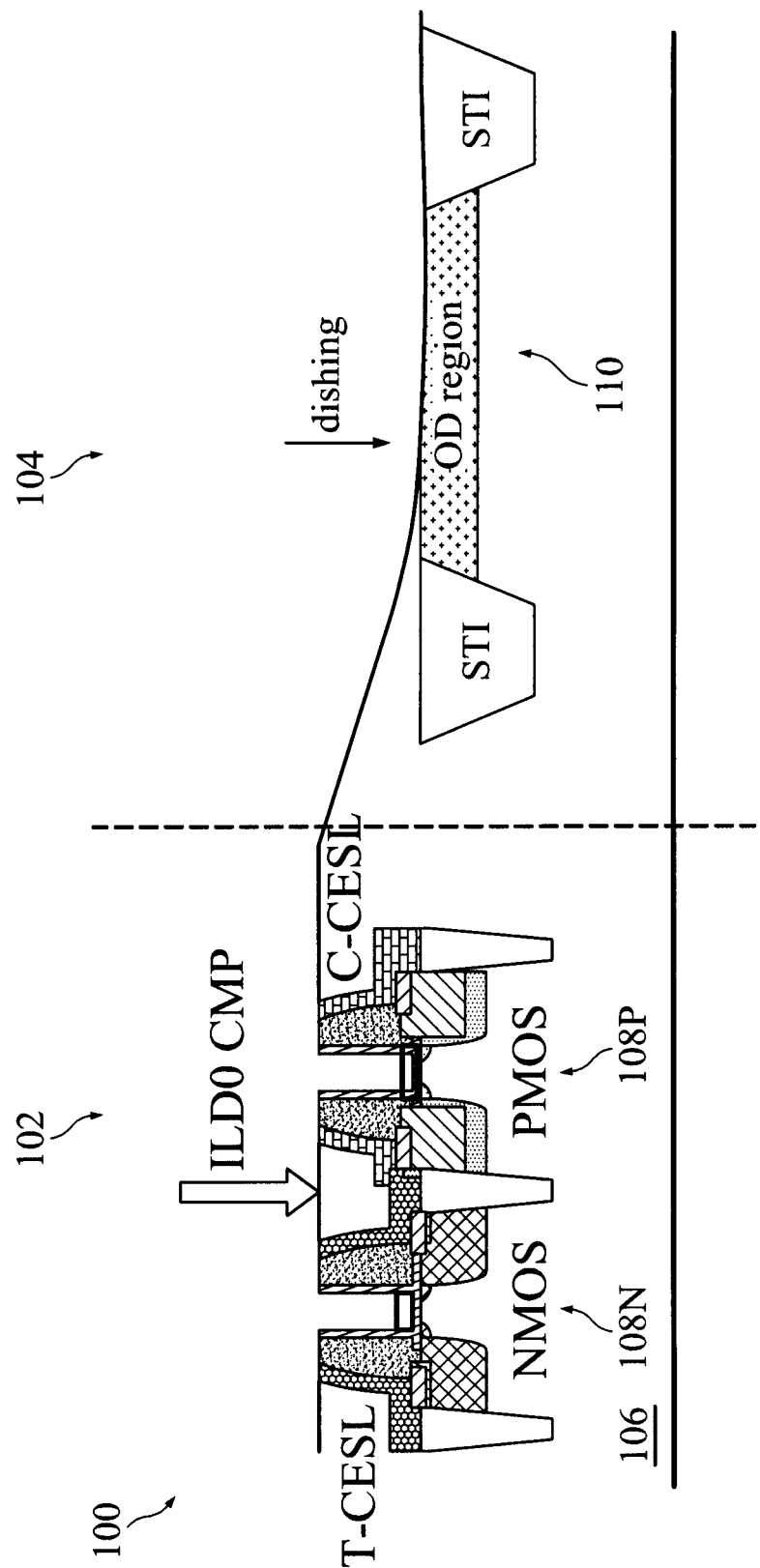
FIGS. 1A and 1B illustrate cross sectional views of a semiconductor device being fabricated in a gate last process, the semiconductor device including an NMOS and PMOS device formed in a high pattern density region and a device formed in a low pattern density region.

The present disclosure relates generally to forming an integrated circuit device on a substrate and, more particularly, to fabricating a decoupling capacitor as part of an integrated circuit. It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 1B:
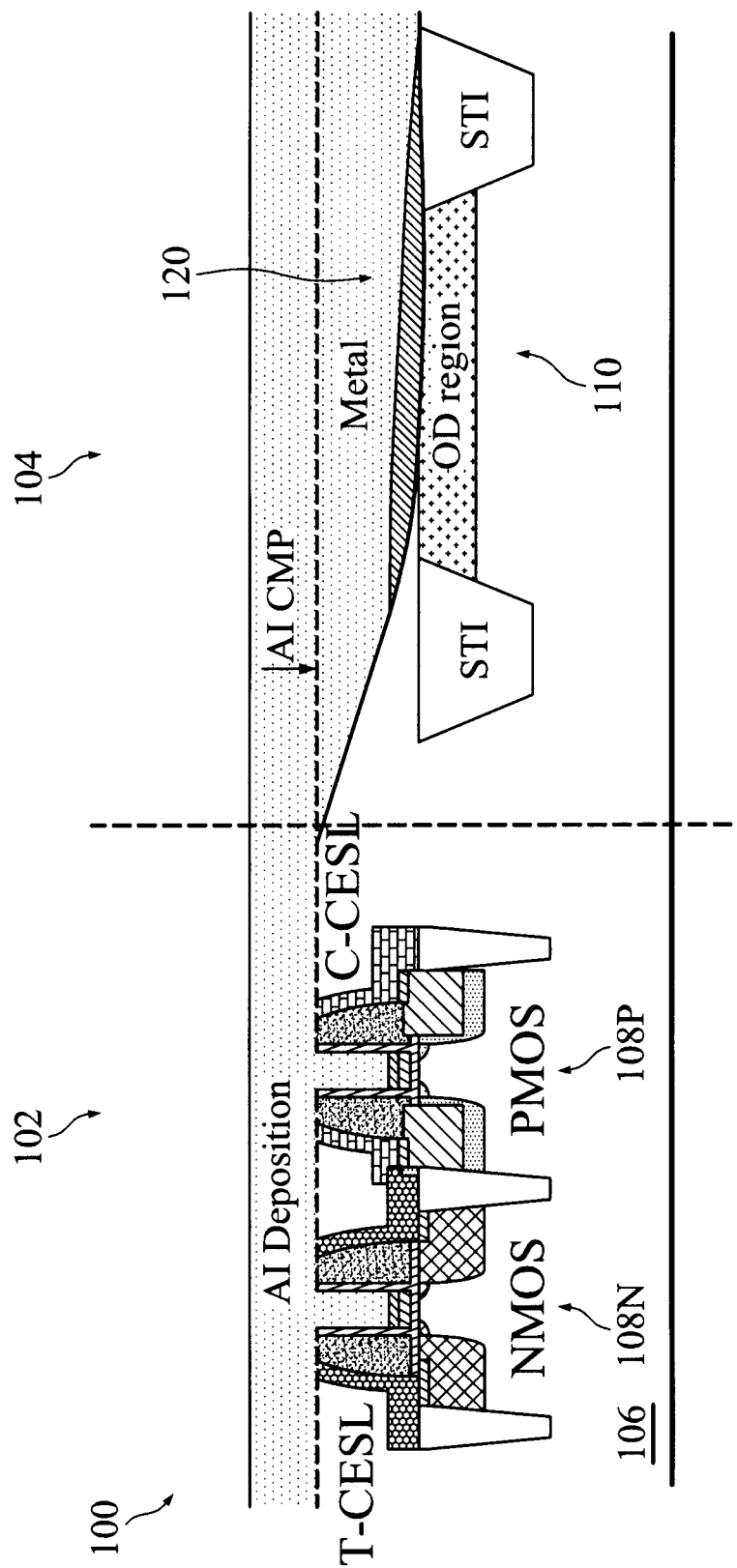

Referring to FIGS. 1A and 1B, illustrated are cross sectional views of a semiconductor device 100 at intermediate stages of fabrication in a gate last process. In the present example, the semiconductor device 100 may include regions 102 and 104 in which various active and passive microelectronic devices may be formed as part of an integrated circuit (IC). For example, the IC may comprise static random access memory (SRAM) and/or other logic circuits, passive components such as resistors, capacitors, and inductors, and active components such as P-channel field effect transistors (pFET), N-channel FET (pFET), metal-oxide semiconductor field effect transistors (MOSFET), complementary metal-oxide semiconductor (CMOS) transistors, bipolar junction transistors (BJT), high voltage transistors, high frequency transistors, other memory cells, and combinations thereof.

The semiconductor device 100 includes a semiconductor substrate 106 such as a silicon substrate. The substrate 106 may include various doping configurations (n-well or p-well) depending on design requirements as is known in the art. The substrate 106 may also include other elementary semiconductors such as germanium and diamond. Alternatively, the substrate 106 may include a compound semiconductor and/or an alloy semiconductor. Further, the substrate 106 may optionally include an epitaxial layer (epi layer), may be strained for performance enhancement, and may include a silicon-on-insulator (SOI) structure.

The region 102 may include a plurality of transistors 108 such as MOSFETs. The transistors may be configured as P-channel (PMOS) 108P or N-channel (NMOS) 108N as is known in the art. The transistors may be isolated from each other and with other devices by a plurality of isolation structures such as shallow trench isolation (STI) features formed in the substrate. The isolation structures may include silicon oxide, silicon nitride, silicon oxynitride, fluoride-doped silicate glass (FSG), and/or a low k dielectric material.

The transistors 108 may be formed in a gate last process. Accordingly, the transistors 108 include a gate dielectric and a dummy polysilicon (or poly) gate structure. The gate dielectric may include an interfacial layer and a high-k dielectric layer such as hafnium oxide ($HfO_2$). Alternatively, the gate dielectric may optionally include other high k dielectric materials such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), and combinations thereof. The transistors 108 may include spacers located on both sidewalls of the gate structure. The spacers may be formed of silicon oxide, silicon nitride, silicon oxynitride, fluoride-doped silicate glass (FSG), or a low k dielectric material.

The transistors 108 further include source/drain (S/D) regions including lightly doped source/drain regions and heavy doped source/drain regions. Further, the PMOS device 108P may include raised S/D regions of silicon germanium (SiGe). The source/drain regions may be formed by implanting p-type or n-type dopants or impurities into the substrate depending on the configuration of the transistors. The transistors 108 may further include silicide features formed on the source/drain regions by a salicide (self-aligned silicide) process to form a contact. The silicide features may include nickel silicide, cobalt silicide, tungsten silicide, tantalum silicide, titanium silicide, platinum silicide, erbium silicide, palladium silicide, or combinations thereof.

The process of forming the transistors 108 may be performed by a normal CMOS process flow. For example, the dummy poly gate structures and source/drain structures may be formed by methods including thermal oxidation, polysilicon deposition, photolithography, ion implantation, etching, and various other methods known in the art.

The region 104 may include an isolated region with a different pattern density as compared to the region 102. That is, region 102 may include more poly gate structures per area than region 104. For example, the region 104 may include a device 110 such a resistor, capacitor, eFuse, BJT, diode, or other type of device Further, the region 104 may include alignment structures, test structures, and/or monitoring structures that may be utilized in fabrication as will be explained in detail later herein. Accordingly, a pattern density of gate structures in region 104 may be substantially less than a pattern density of gate structures in region 102. In the present embodiment, the region 104 includes an area that is at least 20 mm by 20 mm.

After formation of the various microelectronic devices and features in the substrate 106, a stressed layer such as a contact etch stop layer (CESL) may be formed overlying the regions 102 and 104. The CESL may be formed of silicon nitride, silicon oxynitride, and/or other suitable materials. The CESL composition may be selected based upon etching selectivity to one or more additional features of the semiconductor device 100. Additionally, the CESL may be configured as a tensile-CESL (T-CESL) or a compressive-CESL (C-CESL) depending on the transistor type. A dielectric layer such as an inter-layer (or level) dielectric (ILD) layer may be formed overlying the CESL by chemical vapor deposition (CVD), high density plasma CVD (HDP-CVD), spin-on, sputtering, or other suitable methods. The ILD layer may include silicon oxide, silicon oxynitride, or a low k material. In a gate last process, the dummy poly gate structures of transistors are removed so that metal gate structures may be formed in place of the dummy poly gate structures. Accordingly, the ILD layer may be planarized by a chemical mechanical polishing (CMP) process (ILDO CMP process) to expose a top portion of the dummy poly gate structures.

However, it has been observed that following the ILD CMP process there may be some over-polishing and/or dishing effect in region 104. The over-polishing and/or dishing effect may be caused by the different pattern structures and pattern densities in region 102 as compared to region 104. In some situations, the CMP process may even damage and remove a portion of the active regions (e.g., OD region) in the substrate 106 of the region 104.

In FIG. 1B, the dummy poly gate structures of the transistors 108 are removed by an etching process that selectively etches the polysilicon thereby forming trenches in the gate structure. Thereafter, a metal layer is deposited over the substrate 106 filling in the trenches of the region 102, and over the device 110 in the region 104. The metal layer includes any metal material suitable for forming a metal gate or portion thereof, including work function layers, liner layers, interface layers, seed layers, adhesion layers, barrier layers, and fill layers. In the present embodiment, the metal layer includes a work function metal (e.g., P-type work function metal or N-type work function metal) and a fill metal layer of aluminum (Al). The metal layer may then undergo another CMP process (metal Al CMP process) to remove a portion of the metal layer outside of the trenches thereby forming metal gates for the transistors 108 in region 102. However, it has been observed that following the metal Al CMP process there may also be some over-polishing and/or dishing effect on the region 104. Accordingly, there may be some metal residue 120 that remains in the damaged and/or removed portions of the region 104. The metal residue 120 may adversely effect subsequent processing as well as degrade device performance and reliability.

Figures 2A, 2B:
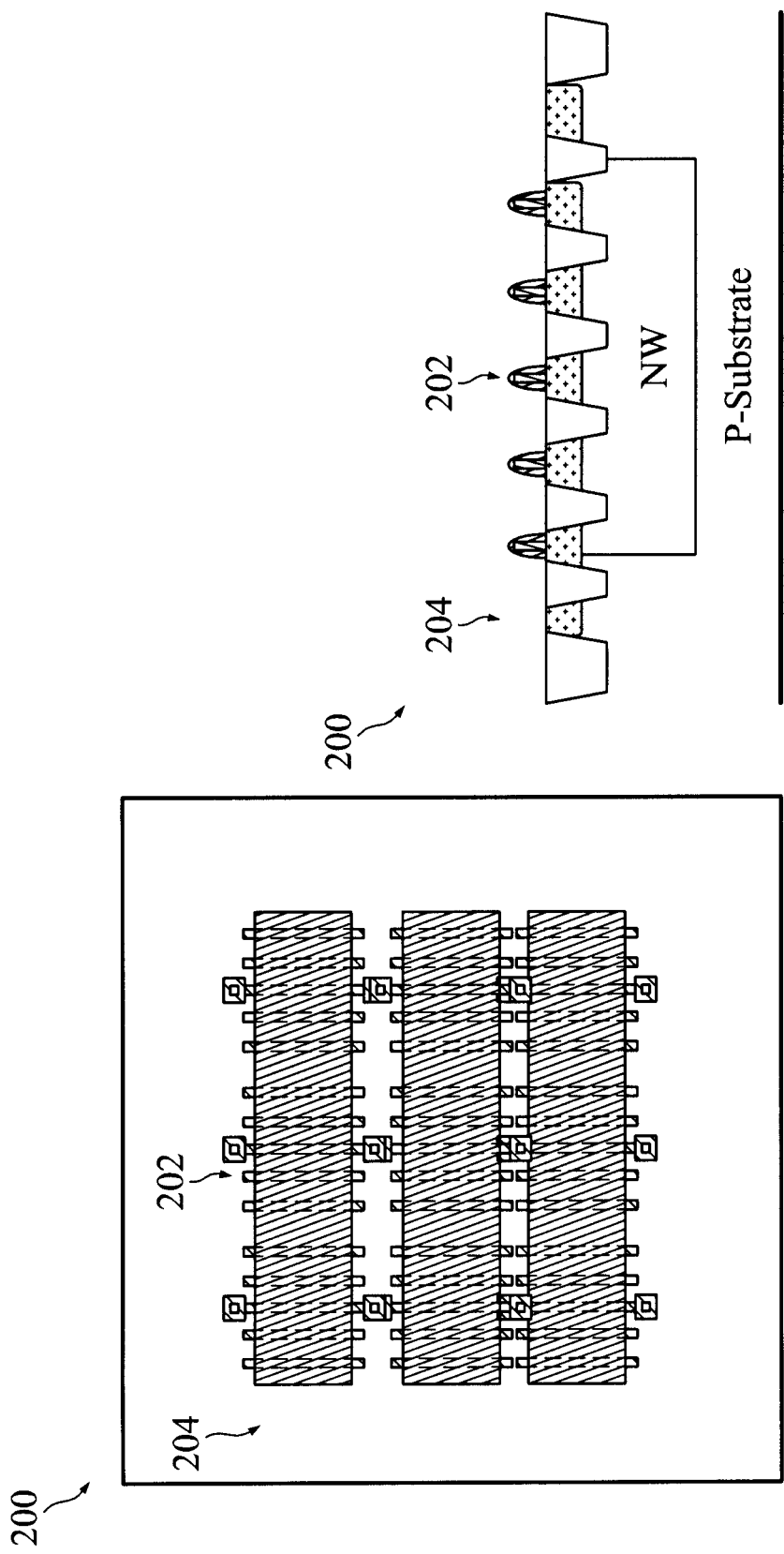
FIGS. 2A and 2B illustrate a top view and cross-sectional view, respectively, of a semiconductor device without a dummy seal ring.

Referring now to FIGS. 2A and 2B, illustrated are a top view and cross-sectional view, respectively, of a semiconductor device 200 having a region with a high pattern density 202 and a region with a low pattern density 204 at an intermediate stage of fabrication. In the present embodiment, the semiconductor device 200 includes a P-type doped substrate (P-substrate) and an N-type doped well (NW). It is understood that other doping configurations may be implemented in the semiconductor device 200. The high pattern density region 202 may include an array of poly gate structures of main devices that are formed on various active regions of the substrate (similar to region 102 of FIG. 1). The low pattern density region 204 may be an isolated region with a substantially less number of poly gate structures than the region 202. Accordingly, similar problems may arise in a poly gate replacement process (or gate last process) when performing a CMP process as was discussed above in FIG. 1.

Figures 3A, 3B:
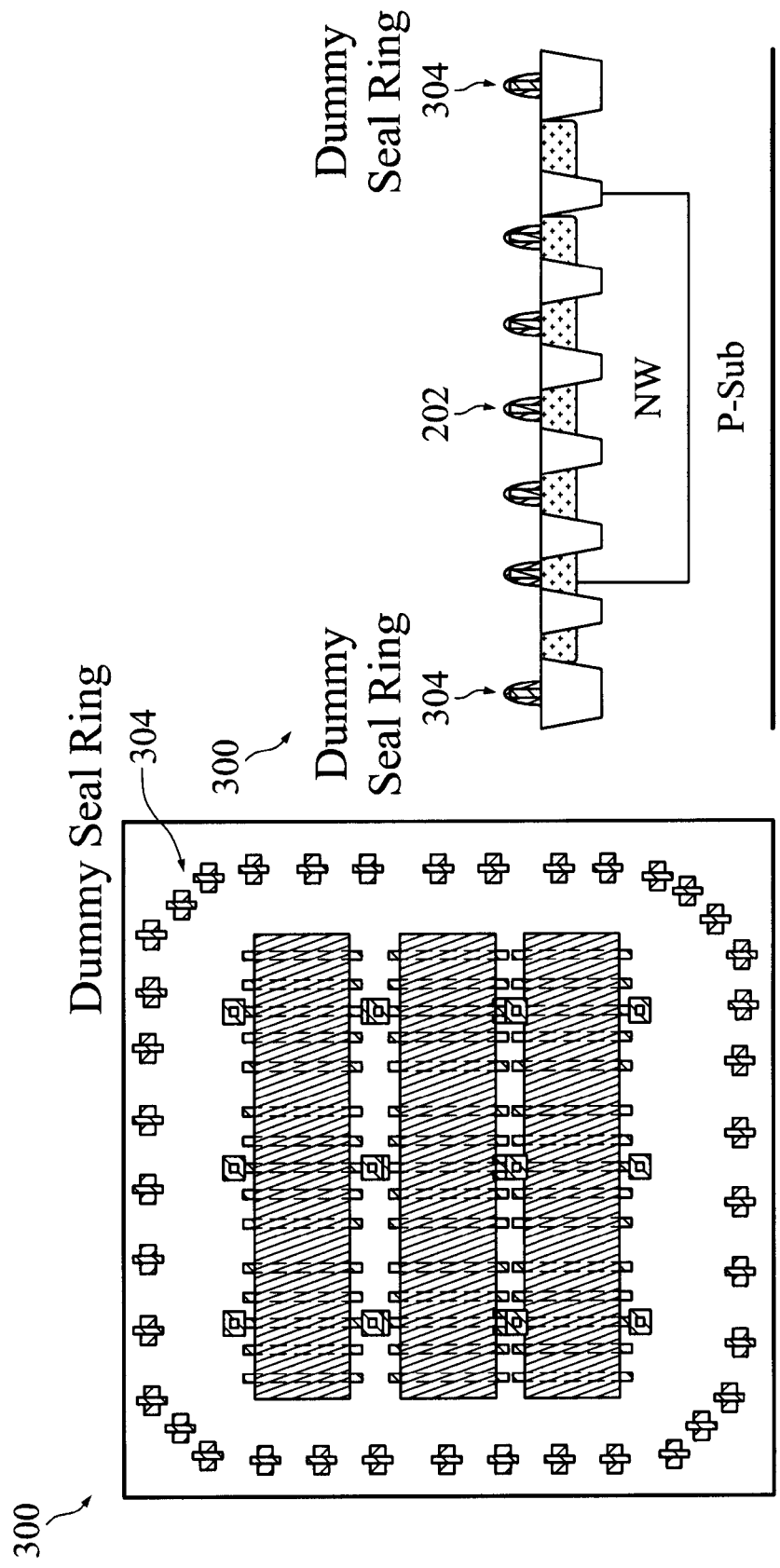
FIGS. 3A and 3B illustrate top and cross-sectional views, respectively, of a semiconductor device having a dummy seal ring according to various aspects of the present disclosure.

Referring now to FIGS. 3A and 3B, illustrated are a top view and cross-sectional view, respectively, of a semiconductor device 300 with a seal ring structure of dummy poly gates 304. The semiconductor device 300 is similar to the semiconductor device 200 of FIG. 2 except that a seal ring of dummy poly gate structures 304 may be formed in the isolated region. Similar features in FIGS. 2 and 3 are numbered the same for the sake of simplicity and clarity. The semiconductor device 300 may include a high pattern density region 202 having an array of dummy poly gate structures of main device that are formed on various active regions of the substrate. The dummy poly gate structures in the region 202 may be subsequently removed and replaced with metal gates in a gate last process as was discussed in FIG. 1.

The semiconductor device 300 may further include a seal ring of dummy poly gate structures 304 that may be formed on the STI surrounding the array of main devices for improved performance during the ILD CMP process and metal CMP process. In some embodiments, the dummy seal ring structure 304 may function as polishing stoppers to prevent dishing and erosion in the isolated region. The dummy seal ring structure 304 may cover at least 5% of a pattern density in the isolated region. It should be noted the dummy seal ring structure 304 may be formed in the same process stage that forms the array of poly gate structures in the region 202. Thus, no extra masks are required to implement the dummy seal ring structure 304.

Figure 4:
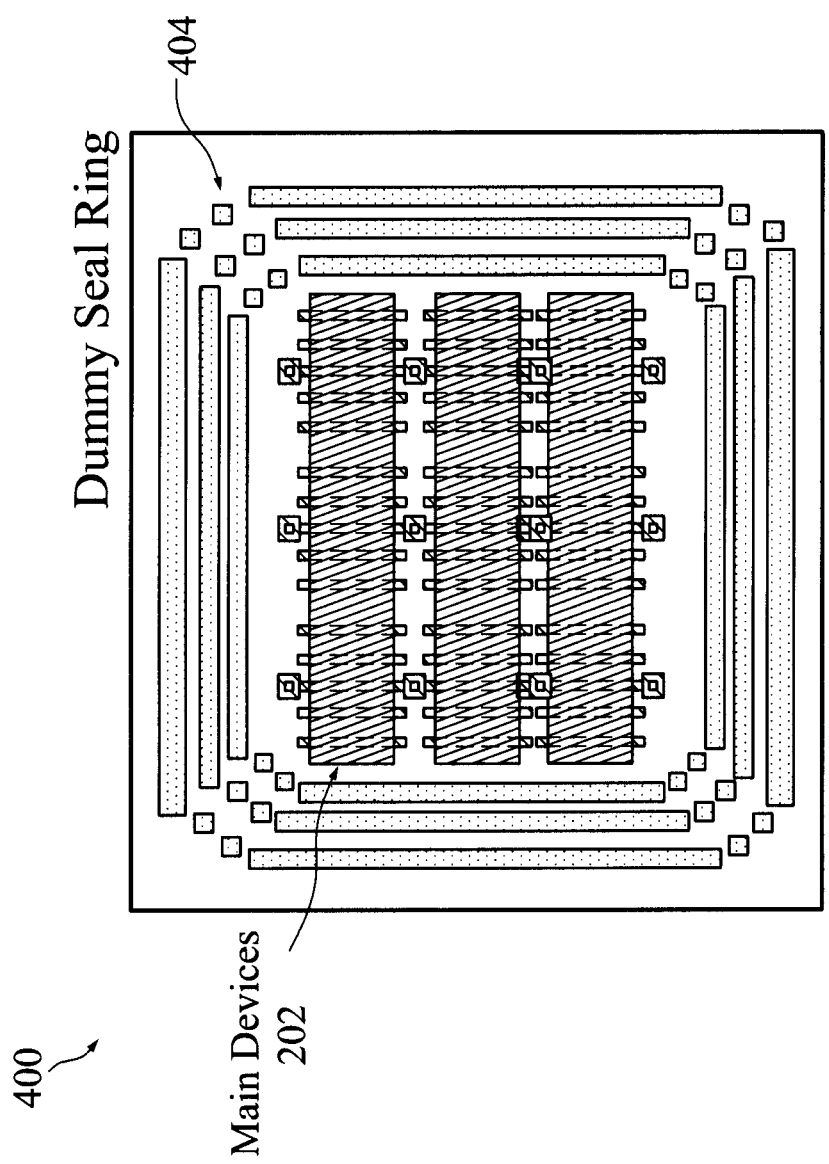
FIG. 4 illustrates a top view of an alternative dummy seal ring according to various aspects of the present disclosure.

Referring now to FIG. 4, illustrated is a top view of with an alternative dummy seal ring structure 404 that may be implemented in the embodiments disclosed herein to improve the CMP process in gate last process. Similar features in FIGS. 2 and 4 are numbered the same for the sake of simplicity and clarity. It is understood that the shape and size of the dummy seal ring structure 404 may vary depending on the design requirements of the various regions in the substrate. The dummy seal ring structure 404 may cover at least 5% of a pattern density in the isolated region. Further, the dummy seal ring structure 404 may be formed in the same process stage that forms the array of poly gates of the main device in the region 202. Thus, no extra masks are required to implement the dummy seal ring structure 404.

Figure 5:
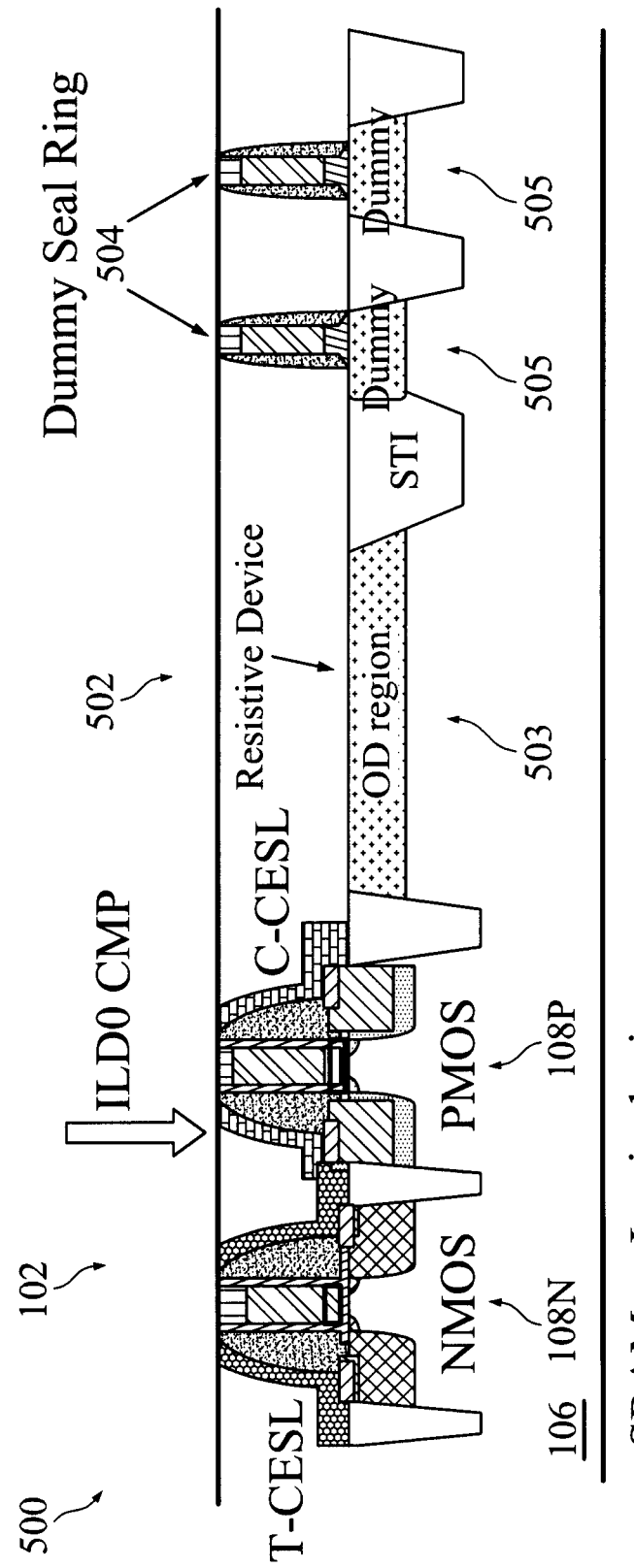
FIG. 5 illustrate a cross-sectional view of a semiconductor device having a region for a logic device and a region for a resistive device with a polishing stopping structure.

Referring now to FIG. 5, illustrated is a cross-sectional view of a semiconductor device 500 having a region for a memory or logic device and region for a resistive device. The semiconductor device 500 may be similar to the semiconductor device 100 of FIG. 1 except that a dummy seal ring is implemented as a polishing stopper. Similar features in FIGS. 1 and 5 are numbered the same for the sake of simplicity and clarity. The semiconductor device 500 may include a region 102 having a plurality of NMOS 108N and PMOS 108P transistors that form a memory device (such as SRAM) or logic device. The semiconductor device 500 may include a region 502 having a resistive device such as a silicide resistor, non-silicide resistor, or a well resistor. The resistive device 502 includes an active region 503 (e.g., OD region) formed in the substrate 106. The semiconductor device 500 may further include a dummy seal ring structure 504 formed on dummy active regions 505 (e.g., Dummy) in the substrate 106. The dummy seal ring structure 504 may be similar to the dummy seal ring structures 304 and 404 of FIGS. 3 and 4, respectively. The dummy seal ring structure 504 may be located close to and around the resistive device in the region 502 so as to act as a polishing stopper in a CMP process.

As previously noted in FIG. 1, in a gate last process, the CMP process may be performed to expose the dummy poly gate structures of the NMOS 108N and PMOS 108P devices in the region 102. It should be noted that the dummy seal ring structure 504 may help prevent dishing or over-polishing in the region 502 thereby preventing damage to the resistive device. The dummy seal ring structure 504 may cover at least 5% of a pattern density in the isolated region. Further, the dummy seal ring structure 504 may be formed in the same process stage that forms the dummy poly gates of the NMOS 108N and PMOS 108P devices in the region 102. Thus, no extra masks are required to implement the dummy seal ring structure 504.

Figure 6:
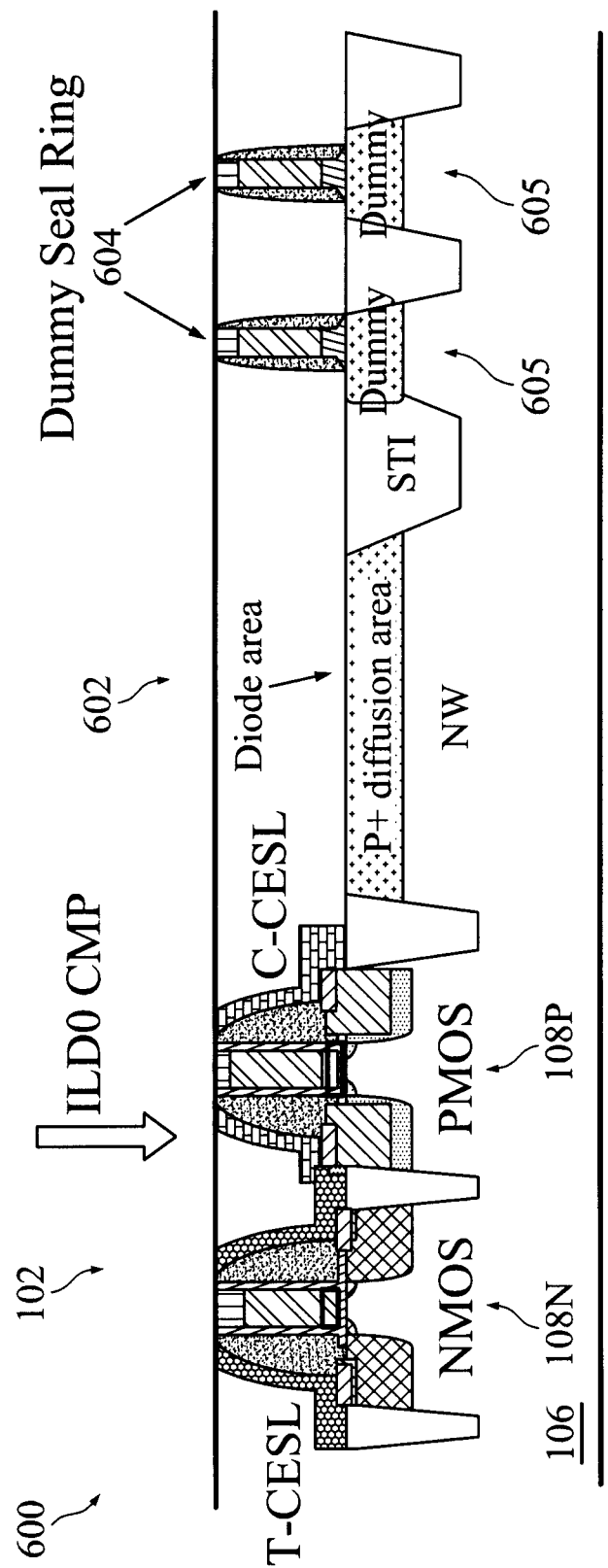
FIG. 6 illustrates a cross-sectional view of a semiconductor device having a region for a logic device and region for a diode with a polishing stopper.

Referring now to FIG. 6, illustrated is a cross-sectional view of a semiconductor device 600 having a region for a memory or logic device and region for a diode device. The semiconductor device 600 may be similar to the semiconductor device 100 of FIG. 1 except that a dummy seal ring structure is implemented as a polishing stopper. Similar features in FIGS. 1 and 6 are numbered the same for the sake of simplicity and clarity. The semiconductor device 600 may include a region 102 having a plurality of NMOS 108N and PMOS 108P transistors that form a logic device or memory device (such as SRAM). The semiconductor device 600 further includes a region 602 having diode of a type known in the art. The diode includes a heavily doped P-type diffusion area (P+ diffusion area) and an N-type doped well (NW) formed in the substrate 106. It is understood that other diode configurations can be implemented in the region 602. The semiconductor device 600 further includes a dummy seal ring structure 604 formed on dummy active regions 605 (Dummy) in the substrate 106. The dummy seal ring structure 604 may be similar to the dummy seal ring structures 304 and 404 of FIGS. 3 and 4, respectively. The dummy seal ring structure 604 may be located close to and around the diode area of the region 602 so as to act as a polishing stopper in a CMP process.

As previously noted in FIG. 1, in a gate last process, the CMP process may be performed to expose the dummy poly gate structures for the NMOS 108N and PMOS 108P devices in the region 102. It should be noted that the dummy seal ring structure 604 may help prevent dishing or over-polishing in the region 602 thereby preventing damage to the P+ diffusion area of the diode. The dummy seal ring structure 604 may cover at least 5% of a pattern density in the isolated region. Further, the dummy seal ring structure 604 may be formed in the same process stage that forms the dummy poly gates of the NMOS 108N and PMOS 108P devices in the region 102. Thus, no extra masks are required to implement the dummy seal ring structure 604.

Figure 7:
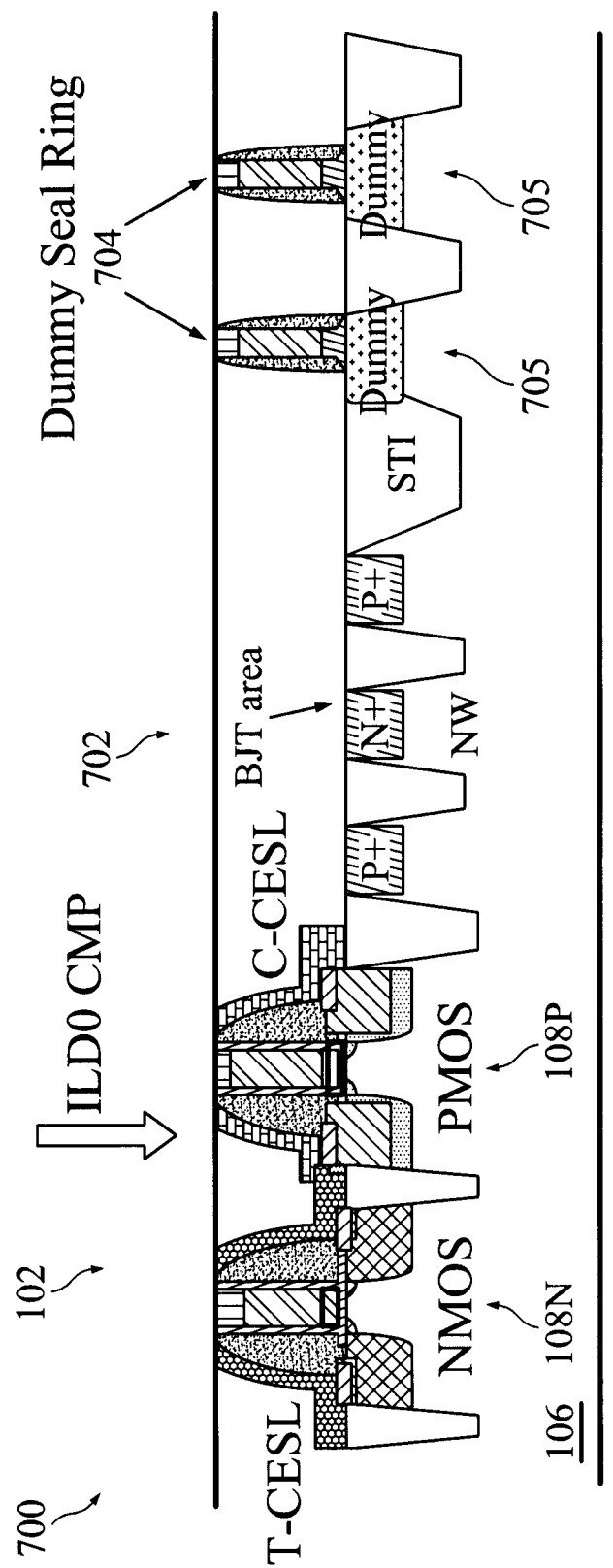
FIG. 7 illustrates a cross-sectional view of a semiconductor device having a region for a logic device and region for a bipolar junction transistor (BJT) device with a polishing stopper.

Referring now to FIG. 7, illustrated is a cross-sectional view of a semiconductor device 700 having a region for a memory or logic device and region for a bipolar junction transistor (BJT) device. The semiconductor device 700 may be similar to the semiconductor device 100 of FIG. 1 except that a dummy seal ring structure is implemented as a polishing stopper. Similar features in FIGS. 1 and 7 are numbered the same for the sake of simplicity and clarity. The semiconductor device 700 includes a region 102 having a plurality of NMOS 108N and PMOS 108P transistor devices that form a logic device or memory device (such as SRAM). The semiconductor device 700 further includes a region 702 having a bipolar junction transistor (BJT). The BJT may be configured as an PNP or NPN transistor as is known in the art. The BJT includes a base, a collector, and an emitter. In the present example, the BJT includes an N-type doped well (NW) formed in the substrate 106, an heavily doped N-type region (N+), and a heavily doped P-type region (P+). It is understood that other BJT configurations may be implemented in the region 702.

The semiconductor device 700 may further include a dummy seal ring structure 704 formed on dummy active regions 705 (Dummy). The dummy seal ring structure 704 may be similar to the dummy seal ring structures 304 and 404 of FIGS. 3 and 4, respectively. The dummy seal ring structure 704 may be located close to and around the BJT area in the region 702 so as to act as a polishing stopper in a CMP process. As previously noted in FIG. 1, in a gate last process, the CMP process may be performed to expose the dummy poly gate structures for the NMOS 108N and PMOS 108P devices in the region 102. It should be noted that the dummy seal ring structure 704 may help prevent dishing or over-polishing in the region 702 thereby preventing damage to the doped regions of the BJT. The dummy seal ring structure 704 may cover at least 5% of a pattern density in the isolated region. Further, the dummy seal ring structure 704 may be formed in the same process stage that forms the dummy poly gates of the NMOS 108N and PMOS 108P devices in the region 102. Thus, no extra masks are required to implement the dummy seal ring structure 704.

Figure 8A:
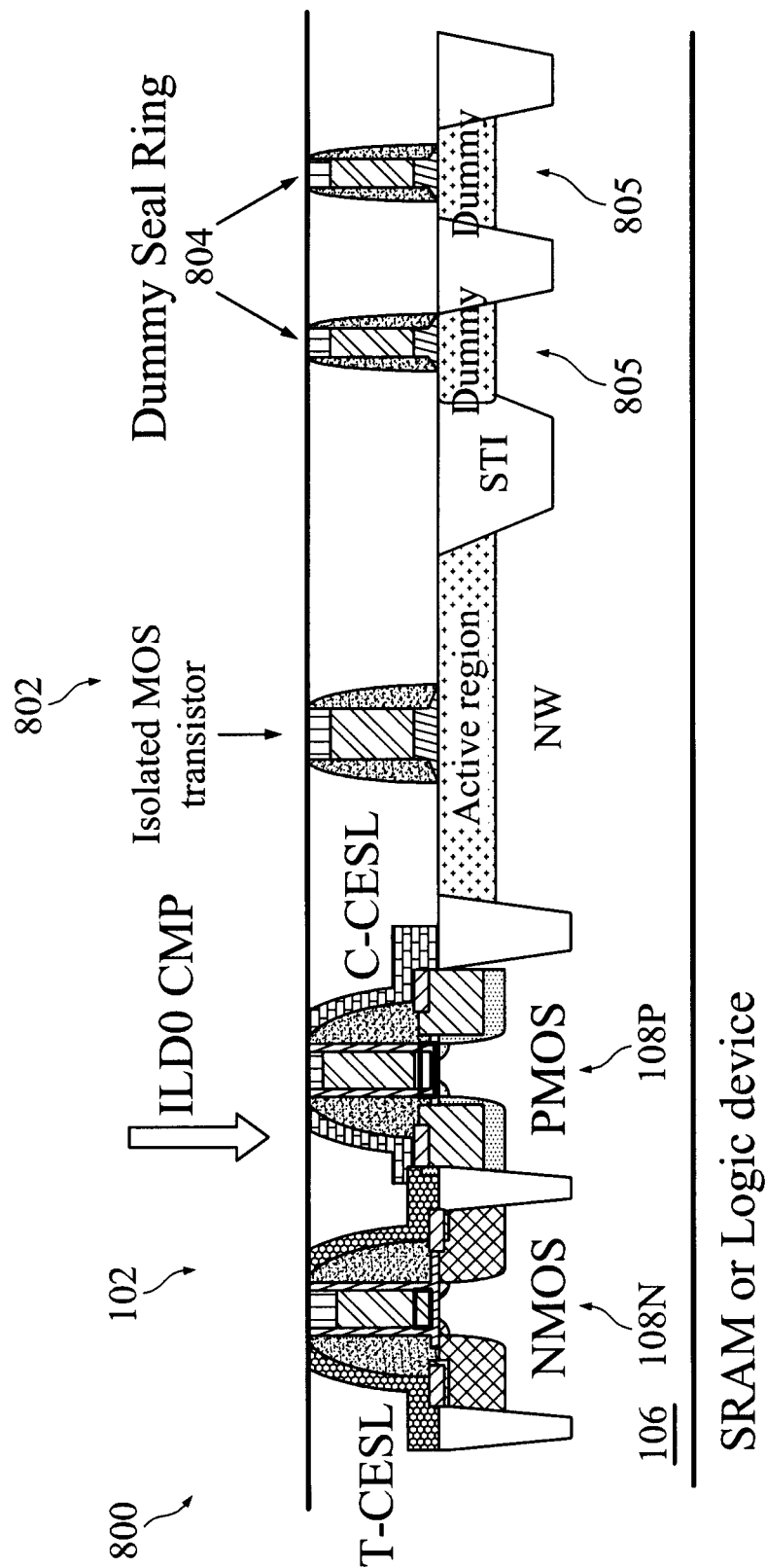
FIGS. 8A and 8B illustrate cross-sectional views of a semiconductor device having a region for a logic device and region for a isolated MOS transistor with a polishing stopper.
Figure 8B:
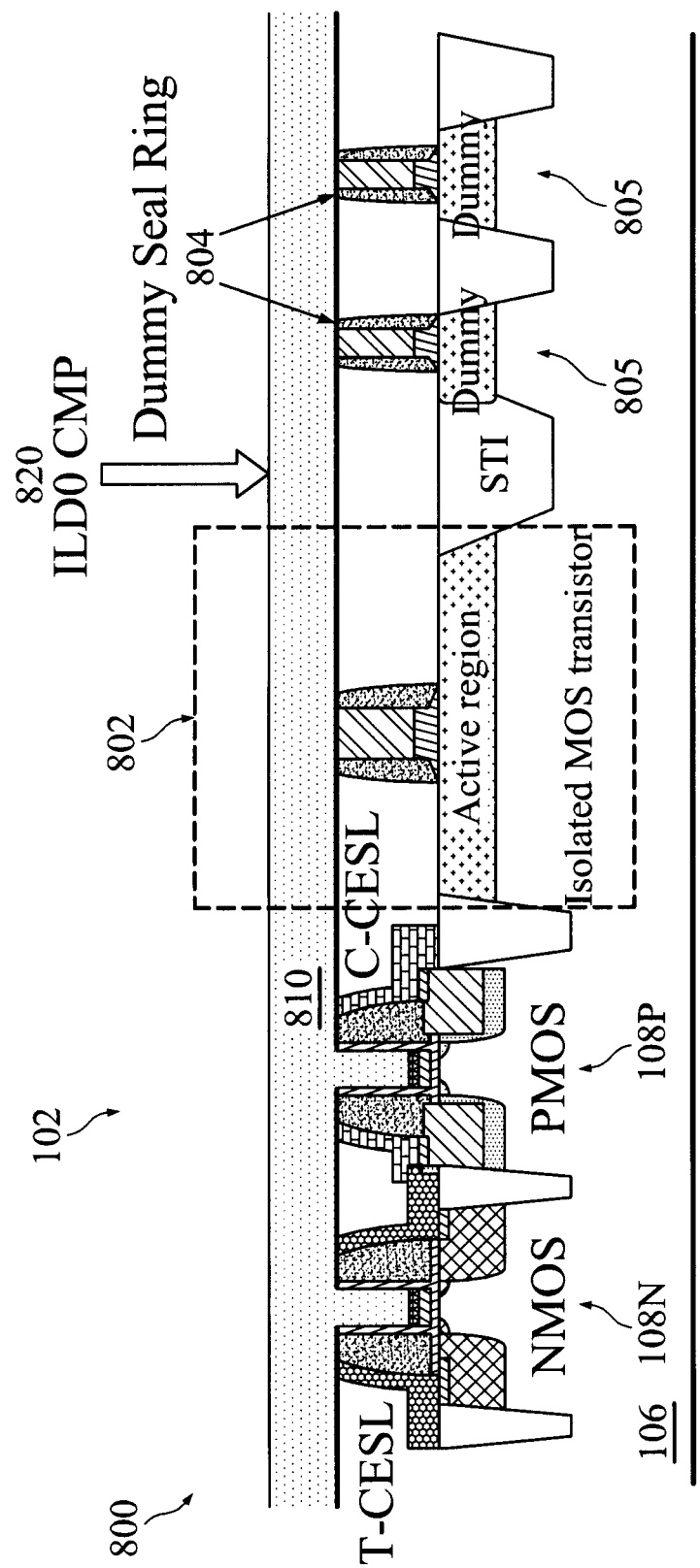

Referring now to FIGS. 8A and 8B, illustrated are cross-sectional views of a semiconductor device 800 having a region for a memory or logic device and region for an isolated MOS transistor. The semiconductor device 800 may be similar to the semiconductor device 100 of FIG. 1 except that a dummy seal ring structure may be implemented as a polishing stopper. Similar features in FIGS. 1 and 8 are numbered the same for the sake of simplicity and clarity. The semiconductor device 800 may include a region 102 having a plurality of NMOS 108N and PMOS 108P transistor devices that form a logic device or memory device (such as SRAM). The semiconductor device 800 may further include a region 802 having a MOS transistor that is isolated from the logic device in the region 102. The semiconductor device 800 may further include a dummy seal ring structure 804 formed on dummy active regions 805 (Dummy). The dummy seal ring structure 804 may be similar to the dummy seal ring structures 304 and 404 of FIGS. 3 and 4, respectively. The dummy seal ring structure 804 may be located close to and around the isolated MOS transistor in the region 802 so as to act as a polishing stopper in a CMP process. As previously noted in FIG. 1, in a gate last process, a CMP process may be performed to remove the dummy poly gate structures for the NMOS and PMOS devices in the region 102. It should be noted that the dummy seal ring structure 804 may help prevent dishing or over-polishing in the region 802 thereby preventing damage to and/or reducing the gate height of isolated MOS transistor. The dummy seal ring structure 804 may cover at least 5% of a pattern density in the isolated region.

In FIG. 8B, following the removal of the dummy poly gates, a metal layer 810 may be deposited and a metal CMP process 820 may be performed. Accordingly, the dummy seal ring structure 804 may prevent dishing effects of the metal CMP process 820 as well. Further, the dummy seal ring structure 804 may be formed in the same process stage that forms the dummy poly gates of the NMOS 108N and PMOS 108P devices in the region 102. Thus, no extra masks are required to implement the dummy seal ring structure 804.

Figure 9:
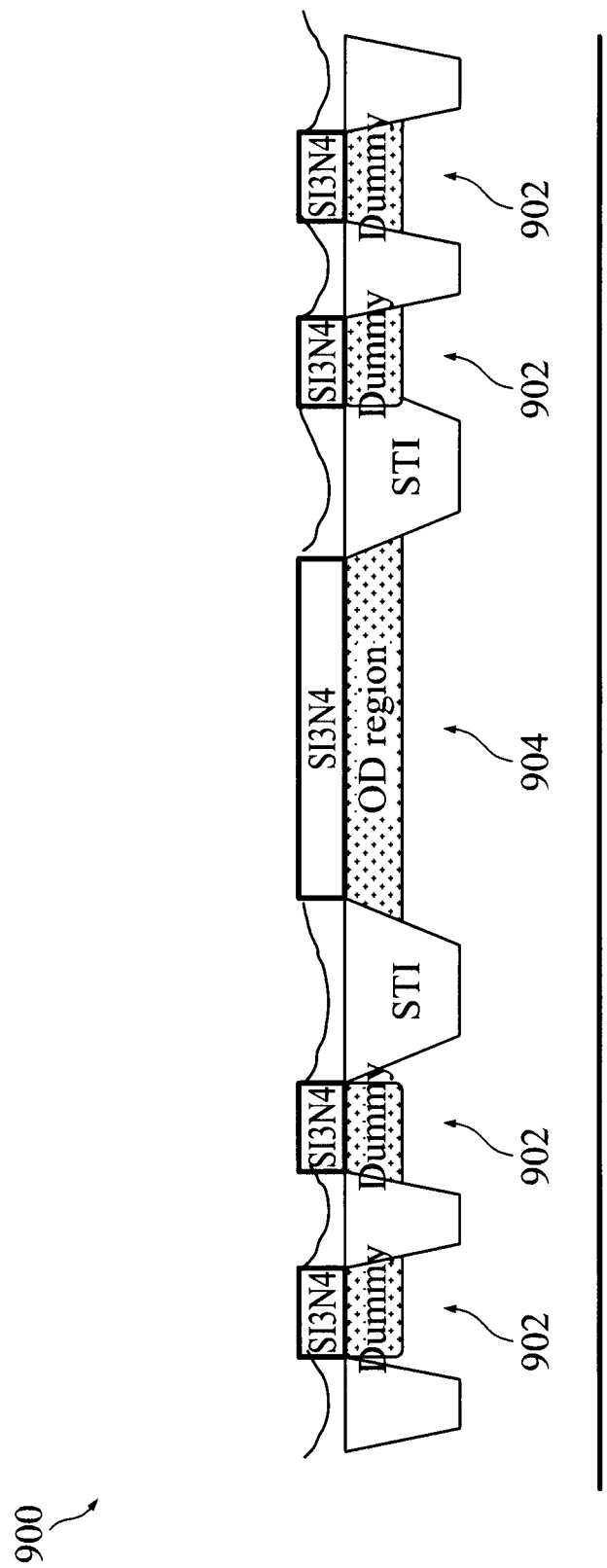
FIG. 9 illustrates a cross-sectional view of a semiconductor device at an intermediate stage of fabrication with dummy active regions according to various aspects of the present disclosure.

Referring now to FIG. 9, illustrated is a cross-sectional view of a semiconductor device 900 at an intermediate stage of fabrication with dummy active regions 902. The semiconductor 900 may include a isolated region 904 for a device such as a resistor, diode, BJT, isolated MOS transistor, or other device discussed above. It has been observed that forming dummy active regions 902 around an edge of the isolated region 902 may also prevent dishing effect in a shallow isolation trench CMP process. Accordingly, these dummy active regions 902 may be implemented in the various examples disclosed herein.

Figure 10:
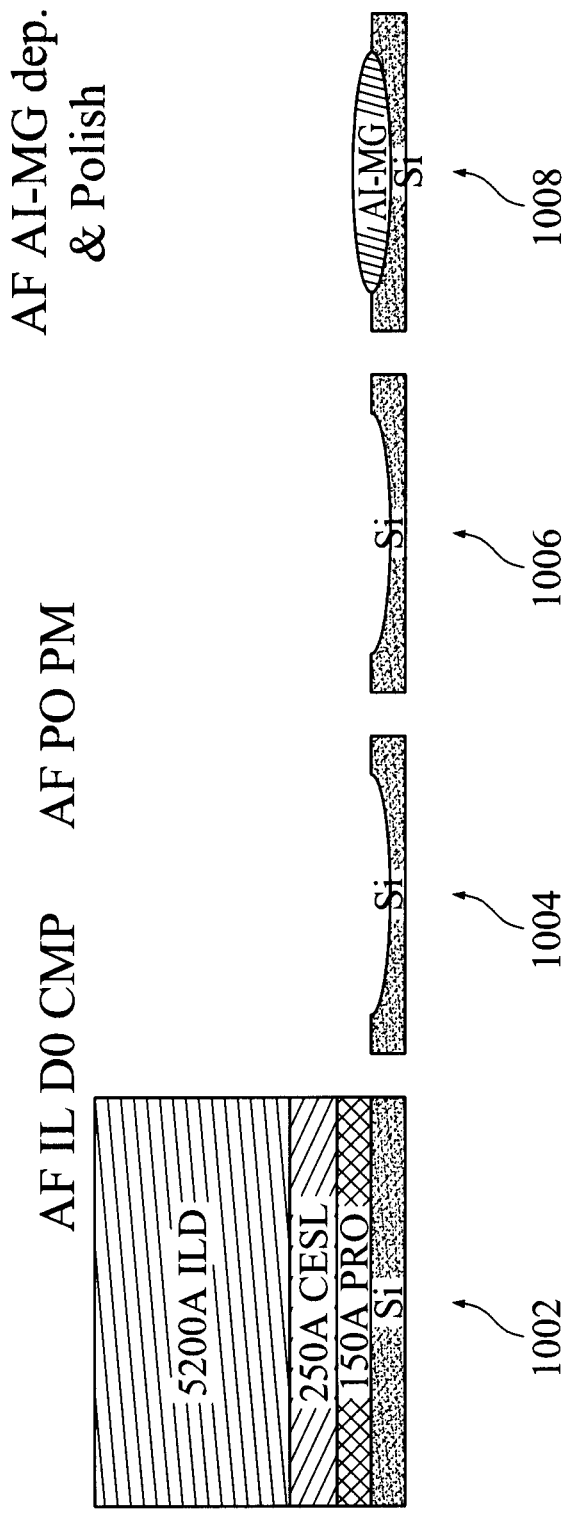
FIG. 10 illustrates cross sectional views of a monitor pad going through a gate last process and developing metal residues.

Referring now to FIG. 10, illustrated are cross sectional views of a monitor pad going through a gate last process and developing metal residues. The monitor pad may be formed in an isolated region of a semiconductor wafer for monitoring various processing steps during fabrication. It has been observed that the monitor pad may suffer from serious dishing from a CMP process that is performed in a gate last process which can result in metal residues remaining on the monitor pad following metal (Al and metal gate) deposition and metal CMP. For example, various material layers 1002 may be formed on the monitor pad during fabrication such a resist protective oxide (RPO), contact etch stop layer (CESL), and inter-layer dielectric (ILD). The specified thicknesses are shown for the sake of an example. As previously noted, the ILD layer may be removed by a CMP process 1004 to expose the dummy poly gates in the region of the NMOS and PMOS devices (logic device or memory device) located away from the monitor pad. It has been observed that the ILD CMP process may cause dishing of the monitor pad due to different pattern densities between the regions as discussed above. The dummy poly gates of the NMOS and PMOS devices may then be removed 1006 thereby forming trenches. A metal gate layer (MG) and aluminum fill layer (Al) may be deposited to fill in the trenches and a metal CMP process may be performed. However, during the metal (Al—MG) deposition and metal CMP (Polish) process, metal residues may remain on the silicon substrate in the dished areas, and thus the monitor pad may be defective for its intended purpose.

Figure 11:
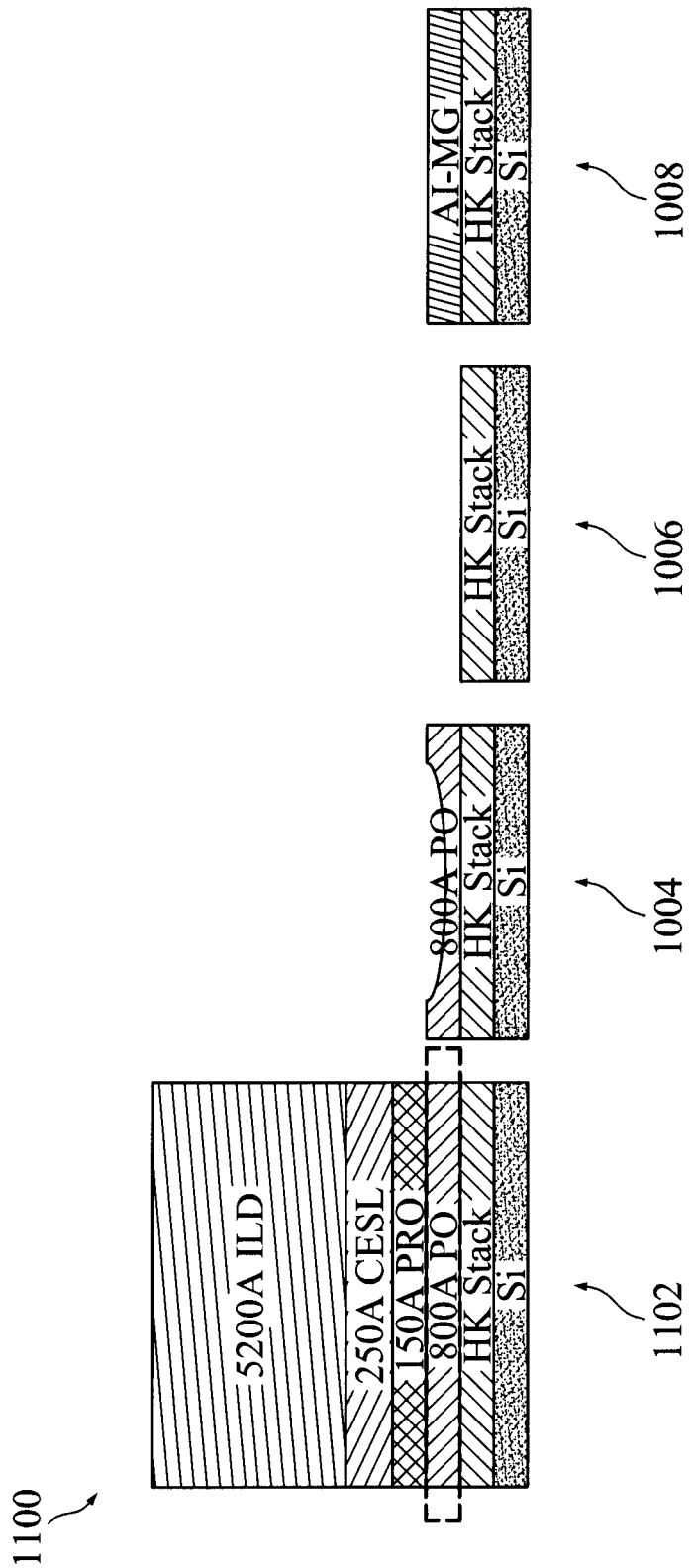
FIG. 11 illustrates cross sectional views of a monitor pad with a polysilicon layer going through a gate last process.

Referring now to FIG. 11, illustrated are cross sectional views of a monitor pad 1100 going through a gate last process. The monitor pad 1100 may be formed in an isolated region of a semiconductor wafer for monitoring various processing steps during fabrication. The monitor pad 1100 is similar to the monitor pad of FIG. 10 except that a polysilicon layer may be added to the monitor pad 1100. The monitor pad may undergo the same processes 1004, 1006, 1008 discussed in FIG. 10. For example, various material layers 1102 may be formed on the monitor pad (in the silicon substrate) during fabrication such high-k dielectric stack (HK), polysilicon layer (PO), resist protective oxide (RPO), contact etch stop layer (CESL), and inter-layer dielectric (ILD). The HK stack and the poly layer may be formed in the same process stage that forms the dummy poly gate structures of the NMOS and PMOS devices in another region of the wafer. As previously noted, the ILD layer may be removed by a CMP process 1004 to expose the dummy poly gates of the NMOS and PMOS devices (logic device or memory device) located away from the monitor pad 1100. Accordingly, the ILD CMP process may cause dishing in the poly layer of the monitor pad 1100. The dummy poly gates of the NMOS and PMOS devices of the logic device may then be removed 1006 as well as the poly layer in the monitor pad 1100. A metal gate (MG) and aluminum filler layer may be deposited to fill in the trenches and a metal CMP process may be performed. It should be noted that there is no metal residue remaining on the silicon substrate.

Figure 12:
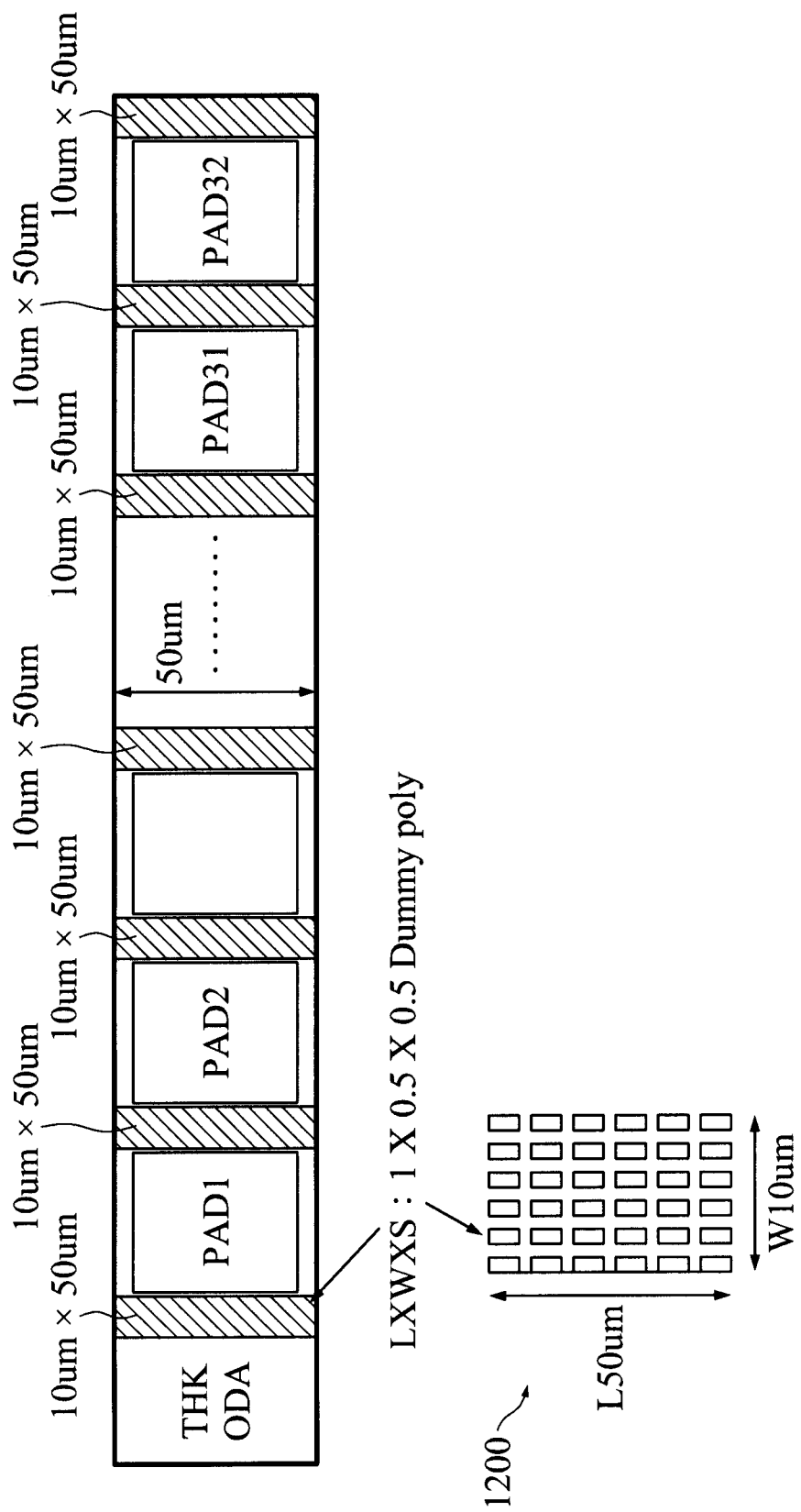
FIG. 12, illustrates a plurality of monitor pads that have dummy poly gate structures surrounding the monitor pads according to various aspects of the present disclosure.

Referring now to FIG. 12, illustrated are a plurality of monitor pads (e.g., PAD1, PAD2 . . . PAD 31, PAD32) that have dummy poly gate structures surrounding the monitor pads. The dummy poly structures 1200 may include a plurality of rectangles in an area measuring about 50 um by 10 um (L×W). It has been observed that by placing the dummy poly structures around the monitor pads, a dishing effect of a CMP process during a gate last process may be reduced to a minimum. The dummy poly structures may act as polishing stoppers as was discussed above. Thus, the integrity of the monitor pads may be maintained for their intended function. It should be noted that the dummy poly structures 1200 may be formed in the same process stage that forms the dummy poly gates of the NMOS and PMOS devices (logic device or memory device) in another region away from the monitor pads. Thus, no extra masks are required to implement the dummy poly structures 1200. Further, it is understood that the shapes of the dummy poly structures 1200 may vary and may include circles, ovals, squares, lines, or various polygons. Moreover, the area of the dummy poly structures 1200 and the size of each dummy poly may vary as well.

Figure 13A:
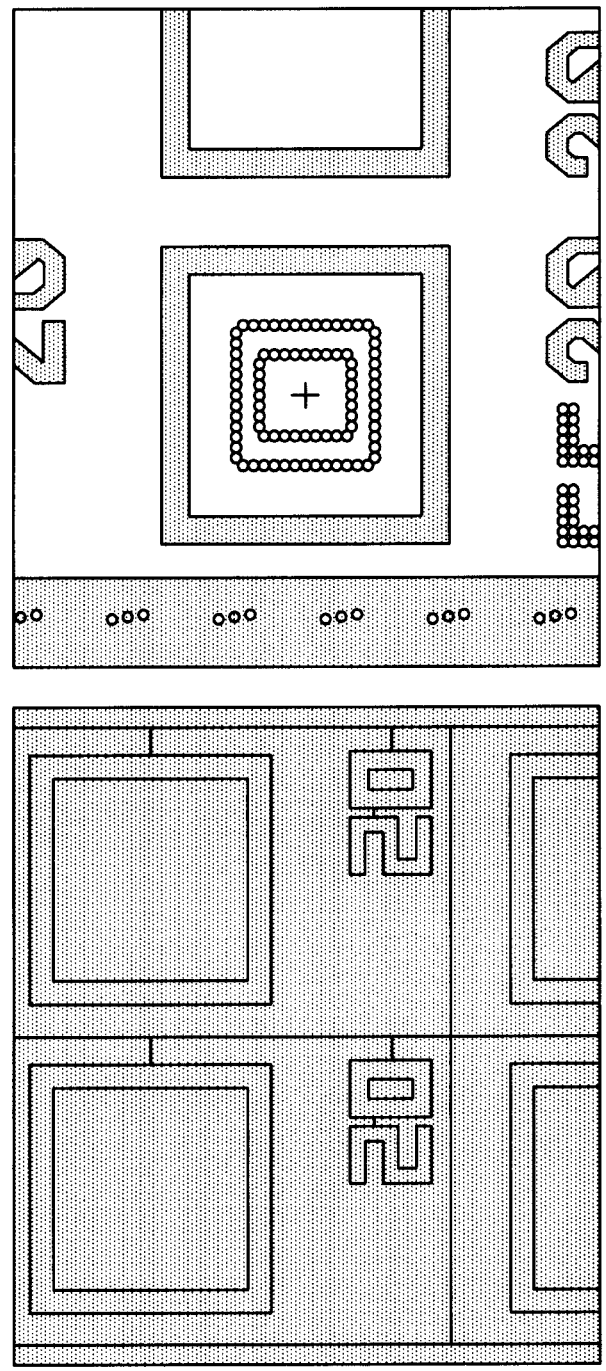
FIGS. 13A, 13B, and 13C illustrate top views of an alignment mark with polishing stoppers formed in an isolated region of a semiconductor wafer according to various aspects of the present disclosure.
Figure 13B:
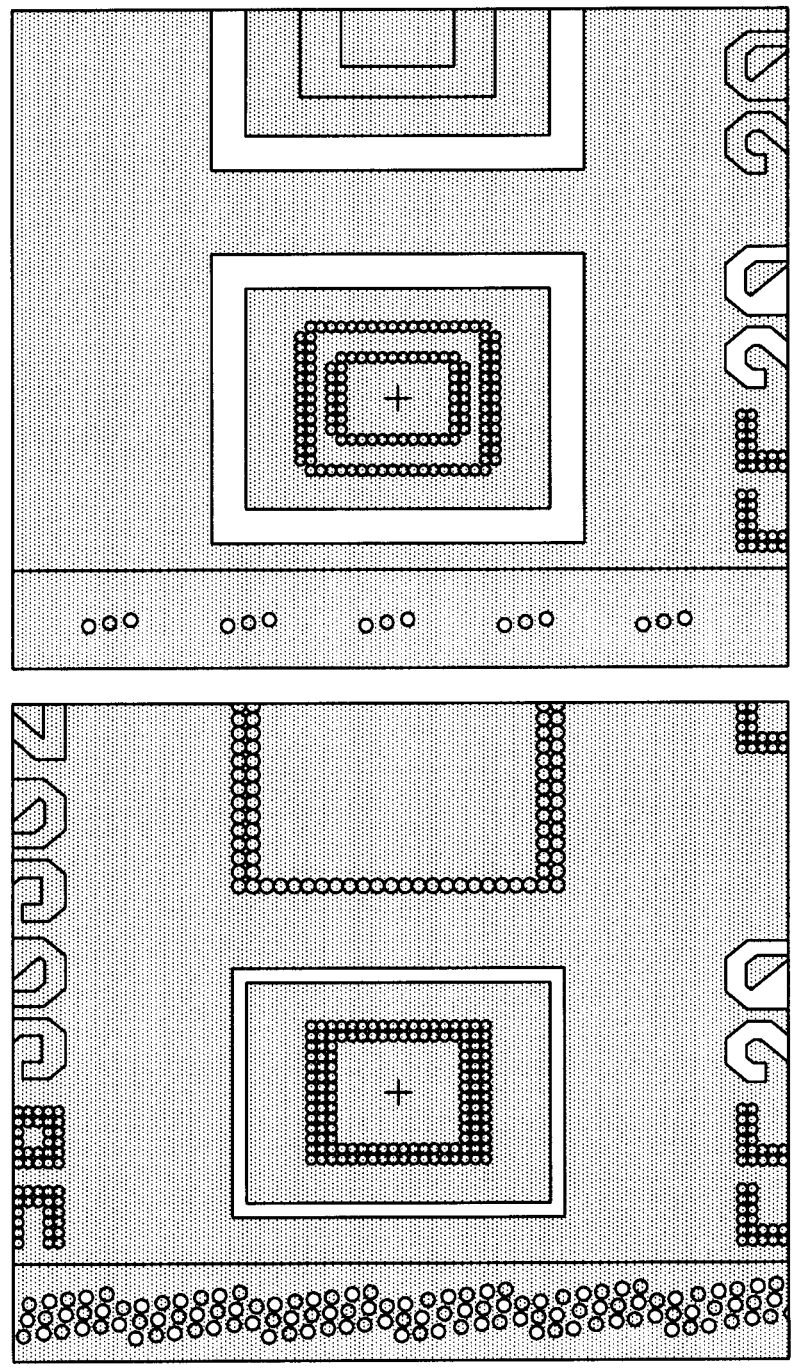
Figure 13C:
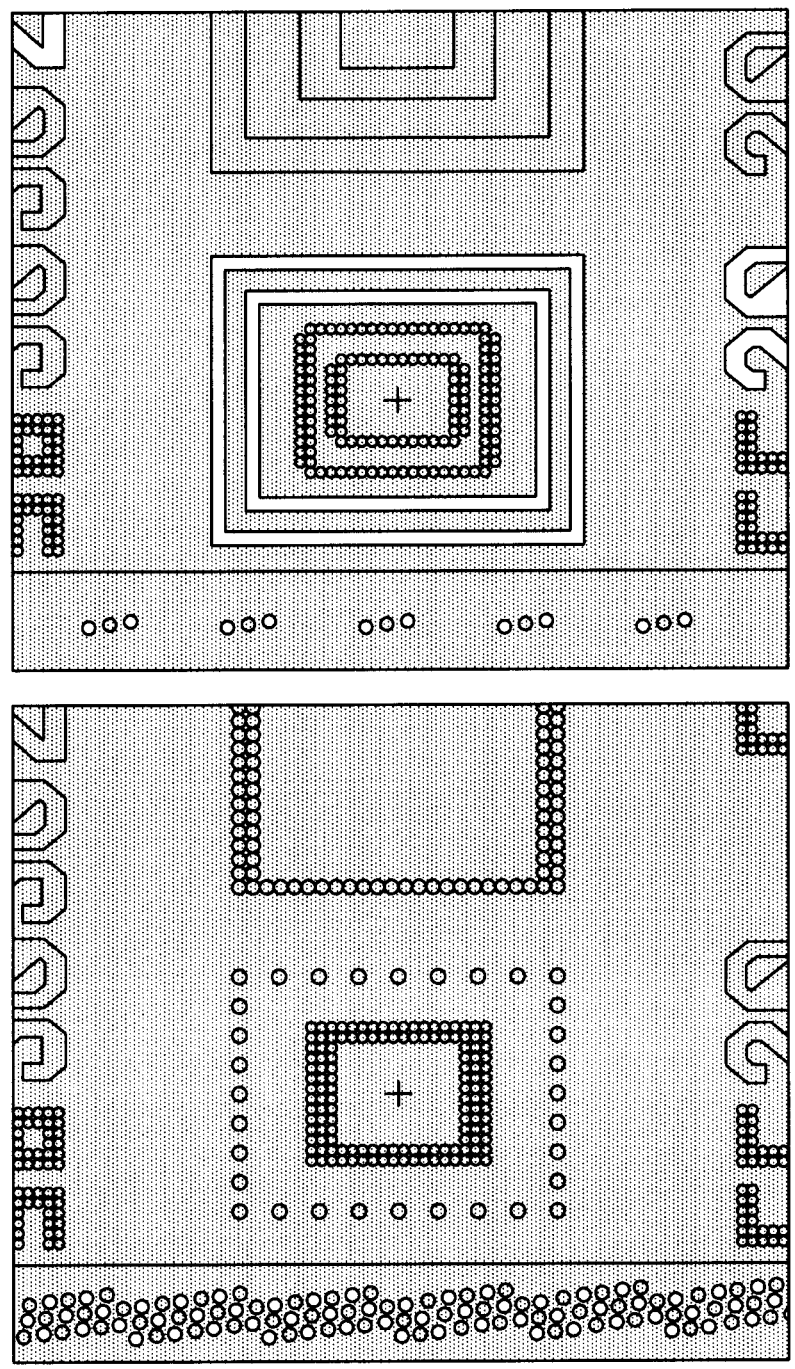

Referring now to FIGS. 13A and 13B, illustrated are top views of an alignment mark formed in an isolated region of a semiconductor wafer accordingly to various aspects of the present disclosure. An alignment mark such as an overlay box may be used to align a photomask (or reticle) and a semiconductor wafer in a photolithography process. However, it has been observed that in the region where the overly box may be located, there may be some dishing effect caused by the ILD CMP process in a gate last process as was discussed above. As a result, metal residues (Al—MG) may remain proximate to or on the overly box after the metal CMP process. The metal residues can adversely effect the alignment process when performing the photolithography process. The alignment process may include an alignment system that uses light radiation to align the overly box with an alignment mark of the photomask.

The metal residues may reflect the light radiation such that the alignment process may be defective. Accordingly, dummy poly structures may be formed around or within the overlay box to prevent dishing by the CMP process as was discussed above, and thus no metal residues will remain following metal deposition and metal CMP. The image quality from the alignment process is greatly improved for the photolithography process. It is understood that various dummy poly patterns may be used for the overlay box to improve overlay image quality. For example, the shape of the dummy poly pattern may include circles, ovals, rectangles, squares, or other polygons. The dummy poly patterns may be located inside the overlay box, or around the overlay box, or inside and around the overlay box. It should be noted that the dummy poly patterns may be formed in the same process stage that forms the dummy poly gates of the NMOS and PMOS devices (logic device or memory device) in another region away from the alignment and/or overlay marks. Thus, no extra masks are required to implement the dummy poly patterns.

In summary, a gate last process may be implemented to form metal gate structures after formation of an interlayer dielectric layer. The gate last process have been observed to be effective in reducing complexity of the front-end-of-the-line (FEOL) process and FEOL defect counts. Also, the gate last process can improve pFET mobility of up to 27%. However, problems have arisen with integrating other devices and structures with the gate last process have. Accordingly, the present disclosure provides a device and method that includes a polishing stopping structure (dummy poly structures) that prevents or reduces the risk of a CMP process (ILD CMP and metal CMP) from over-polishing and damaging those devices and structures such as resistors, capacitors, diodes, BJTs, isolated MOS transistors, alignment marks, overlay boxes, and monitor pads. The various polishing stopper structures disclosed herein may cover at least 5% of a pattern density of an isolated region. Further, the polishing stopping structure may be formed in the same stage as the process that forms the dummy polysilicon gate structure (polysilicon deposition and gate patterning), and thus the devices and methods disclosed herein do not require additional processing steps (e.g., photomask) and/or added complexity to the current process flow. Is understood that different embodiments disclosed herein offer different advantages, and that no particular advantage is necessarily required for all embodiments.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, although a gate last process has been described with the embodiments herein, it is understood that the embodiments disclosed herein may be implemented in a hybrid process that includes a gate first process and a gate last process. Further, various embodiments disclosed herein may be combined and/or formed concurrently with various other embodiments disclosed herein.

What is claimed is:

1. A method of semiconductor device fabrication, comprising:
    forming a plurality of gate structures in a first portion of a substrate;

forming a first metal gate structure in a second portion of the substrate, the first metal gate structure being surrounded by an isolation region;

forming a plurality of dummy gate structures in the second portion of the substrate, wherein the plurality of dummy gate structures are configured in a ring formation encircling the metal gate structure and the isolation region, wherein the plurality of dummy structures have a top surface that is substantially planar with a top surface of the plurality of gate structures, and wherein a first polishing stopper covers at least 5% of a pattern density of the second portion of the substrate;

forming a monitor pad in a third portion of the substrate, wherein the monitor pad includes a plurality of layers disposed in a stack, wherein the monitor pad includes at least two layers that have a same composition as at least two layers of the plurality of gate structures in the first portion of a substrate;

using the monitor pad to monitor a plurality of processing steps during the fabrication including at least one of monitoring a thickness of a deposited material and monitoring a planarization process;

forming an alignment mark in a third portion of the substrate; and using the alignment mark to align a photomask and the semiconductor substrate during a photolithography process.

2. The method of claim 1, wherein the plurality of gate structures in the first portion each include a high-k dielectric layer and a metal layer, and wherein the at least two layers of the monitor pad include the high-k dielectric layer and the metal layer.

3. The method of claim 1, further comprising:
forming a second plurality of dummy structures disposed adjacent at least two sides of the monitor pad, wherein the second plurality of dummy structures is formed concurrently with the plurality of gate structures.

4. The method of claim 1, further comprising:
forming a second plurality of dummy structures disposed adjacent at least two sides of the alignment mark, wherein the second plurality of dummy structures if formed concurrently with the plurality of gate structures.

5. The method of claim 1, further comprising:
forming an active region in the second portion of the substrate, wherein the first metal gate structure is formed on the active region; and
forming the isolation region immediately adjacent the active region.

6. The method of claim 5, further comprising:
forming dummy active regions in the second portion of the substrate concurrently with forming the active region, wherein the plurality of dummy structures are formed on the dummy active regions.

7. The method of claim 1, wherein the forming the plurality of dummy structures includes forming a polysilicon layer.

8. The method of claim 1, wherein the second portion of the substrate has an area that is at least 20 mm by 20 mm.

9. The method of claim 1, wherein the forming the plurality of gate structures in the first portion of the substrate includes forming a dummy polysilicon layer and wherein the forming the plurality of dummy gate structures including forming a polysilicon layer concurrently with the dummy polysilicon layer.

10. The method of claim 1, further comprising:
forming an interlayer dielectric (ILD) on the plurality of gate structures and the plurality of dummy gate structures;
performing a chemical mechanical polish (CMP) process on the ILD; and
using a top surface of the plurality of dummy gate structures as a stopper for the CMP process.

11. A method of fabricating a semiconductor device, comprising:
forming an isolation region in a semiconductor substrate, thereby defining a first area and a second area, the first and second areas being interposed by the isolation region; forming a plurality of transistors formed in the first area, wherein the forming the plurality of transistors includes:
forming a first plurality of dummy polysilicon gate structures;
removing a layer of each of the first plurality of dummy polysilicon gate structures to provide trenches; and
forming metal gate electrodes in the trenches;
forming a device element formed in the second area, wherein the device element is selected from the group consisting of (1) a MOS device including a gate structure, (2) a BJT device including a collector, an emitter, and a base, (3) a diode including a plurality of doped regions, and (4) a resistor;
forming a polishing stopper in the second area, wherein forming the polishing stopper includes forming a second plurality of dummy polysilicon gate structures in a ring encircling the device element, wherein the second plurality of dummy polysilicon gate structures are formed concurrently with forming the first dummy polysilicon gate structures of the plurality of transistors;
forming an alignment mark in a third portion of the substrate; and
using the alignment mark to align a photomask and the semiconductor substrate during a photolithography process.

12. The method of claim 11, further comprising:
forming a monitor pad on the semiconductor substrate, wherein the monitor pad includes a stack of material including a first dielectric layer, a first conductive layer, and a second dielectric layer; and
forming a polishing stopper adjacent the monitor pad, the polishing stopper formed over the substrate.

13. The method of claim 12, wherein the forming the monitor pad is performed concurrently with forming the dummy polysilicon gate structure.

14. A method of semiconductor device fabrication, comprising:
forming a plurality of gate structures in a first portion of a substrate, wherein the plurality of gate structures have a first height;
forming a first metal gate structure in a second portion of the substrate, the first metal gate structure being surrounded by an isolation region; and
forming a first plurality of dummy gate structures in the second portion of the substrate, wherein the first plurality of dummy gate structures are configured in a ring formation encircling the metal gate structure and the isolation region, wherein the first plurality of dummy structures have a top surface that is substantially planar with the plurality of gate structures;
forming an alignment mark in a third portion of the substrate;

forming a second plurality of dummy gate structures in the third portion of the substrate, wherein the second plurality of dummy gate structures are formed concurrently with the first plurality of dummy gate structures;

using the alignment mark to align a photomask and the semiconductor substrate during a photolithography process; and wherein the second plurality of dummy gate structures covers at least 5% of a pattern density of the third portion of the substrate.

15. The method of claim 14, wherein the second plurality of dummy gate structures are formed inside a feature of the alignment mark.

16. The method of claim 15, wherein the feature of the alignment mark is an overlay box.

17. The method of claim 14, wherein the first plurality of dummy gate structures covers at least 5% of a pattern density of the second portion of the substrate.

* * * * *